(12) United States Patent  
Zhang et al.

(10) Patent No.: US 11,133,309 B2
(45) Date of Patent: Sep. 28, 2021

(54) MULTI-THRESHOLD VOLTAGE GATE-ALL-AROUND TRANSISTORS

(71) Applicant: International Business Machines Corporation, Armonk, NY (US)

(72) Inventors: Jingyun Zhang, Albany, NY (US); Takashi Ando, Tuckahoe, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 16/420,753

(22) Filed: May 23, 2019

(65) Prior Publication Data

US 2020/0373300 A1 Nov. 26, 2020

(51) Int. Cl.
*H01L 21/8238* (2006.01)
*H01L 27/092* (2006.01)
*H01L 29/40* (2006.01)
*H01L 29/423* (2006.01)
*H01L 29/49* (2006.01)
(Continued)

(52) U.S. Cl.
CPC .... *H01L 27/0922* (2013.01); *H01L 21/02532* (2013.01); *H01L 21/02603* (2013.01); *H01L 21/28088* (2013.01); *H01L 21/28158* (2013.01); *H01L 21/3115* (2013.01); *H01L 21/31111* (2013.01); *H01L 21/31144* (2013.01); *H01L 21/823807* (2013.01); *H01L 21/823842* (2013.01); *H01L 21/823857* (2013.01); *H01L 29/0673* (2013.01); *H01L 29/408* (2013.01); *H01L 29/42392* (2013.01); *H01L 29/4908* (2013.01); *H01L 29/66545* (2013.01); *H01L 29/78618* (2013.01); *H01L 29/78696* (2013.01); *H01L 2029/42388* (2013.01)

(58) Field of Classification Search
CPC ....... H01L 21/823857; H01L 21/28158; H01L 21/823462; H01L 27/0922; H01L 29/0673
See application file for complete search history.

(56) References Cited

U.S. PATENT DOCUMENTS 9,613,870 B2 4/2017 Ando
9,812,449 B2 11/2017 Obradovic
(Continued)

OTHER PUBLICATIONS

Jingyun Zhang et al.; "High-k metal gate fundamental learning and multi-Vt options for stacked nanosheet gate-all-around transistor" 2017 IEEE International Electron Devices Meeting (IEDM) Year: 2017, pp. 22.1.1-22.1.4.
(Continued)

*Primary Examiner* — Mark V Prenty
(74) *Attorney, Agent, or Firm* — Fleit Intellectual Property Law; Thomas S. Grzesik

(57) ABSTRACT

A method for forming a semiconductor device structure includes removing a portion of a first dielectric layer surrounding each of a plurality of channel layers of at least a first nanosheet stack. A portion of a second dielectric layer surrounding each of a plurality of channel layers of at least a second nanosheet stack is crystallized. A dipole layer is formed on the etched first dielectric layer and the crystallized portion of the second dielectric layer. The dipole layer is diffused into the etched first dielectric layer. The crystallized portion of the second dielectric layer prevents the dipole layer form diffusing into the second dielectric layer.

7 Claims, 15 Drawing Sheets

(51) Int. Cl.
 H01L 29/786 (2006.01)
 H01L 29/66 (2006.01)
 H01L 21/02 (2006.01)
 H01L 21/28 (2006.01)
 H01L 21/311 (2006.01)
 H01L 21/3115 (2006.01)
 H01L 29/06 (2006.01)

(56) References Cited

U.S. PATENT DOCUMENTS

| | | |
|---|---|---|
| 9,997,519 B1 | 6/2018 | Bao |
| 10,026,652 B2 | 7/2018 | Wang |
| 10,056,454 B2 | 8/2018 | Kim |
| 10,825,736 B1 * | 11/2020 | Zhang ............... H01L 21/02186 |
| 2018/0090326 A1 | 3/2018 | Jagannathan |

OTHER PUBLICATIONS

Disclosed Anonymously, "Method and Structure to Achieve Multi-Vt for Gate-all-around Field Effect Transistors" IPCOM000255835D, Oct. 16, 2018.

Disclosed Anonymously, "Multiple VT for Gate-All-Around FETs with Suspension Thicknesses (Tsus) Modulation" IPCOM000255894D, Oct. 19, 2018.

Barry P. Linder et al., Process optimizations for NBTI/PBTI for future replacement metal gate technologies, IEEE International Reliability Physics Symposium, 4B.1.1-4B.1.5 (2016).

J.W. Park et al., "Reflective High-Energy Electron Diffraction Investigation of the Crystallization of Ultra-Thin Oxides", Journal of the Korean Physical Society, vol. 47, No. 2, Aug. 2005, pp. L182L184.

* cited by examiner

MULTI-THRESHOLD VOLTAGE GATE-ALL-AROUND TRANSISTORS

BACKGROUND OF THE INVENTION

The present invention generally relates to metal-oxide-semiconductor field-effect transistors (MOSFET), and more particular relates to gate-all-around transistors.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

As semiconductor devices scale to smaller dimensions, gate-all-around devices such as nanosheet devices provide advantages. For example, gate-all-around devices provide area efficiency. Gate-all-around devices further provide, for example, increased drive current within a given layout area.

SUMMARY OF THE INVENTION

In one embodiment, a method for forming a semiconductor device comprises removing a portion of a first dielectric layer surrounding each of a plurality of channel layers of at least a first nanosheet stack. At least a portion of a second dielectric layer surrounding each of a plurality of channel layers of at least a second nanosheet stack is crystallized. A dipole layer is formed on the etched first dielectric layer and the crystallized portion of the second dielectric layer. The dipole layer is diffused into the etched first dielectric layer. The crystallized portion of the second dielectric layer prevents the dipole layer form diffusing into the second dielectric layer.

In another embodiment, a semiconductor device comprises a first gate-all-around transistor having a first threshold voltage. The first gate-all-around transistor comprises at least a first gate structure surrounding one or more channel layers of a first nanosheet stack. The first gate structure comprises a first dielectric layer comprising a first thickness. The semiconductor device further comprises a second gate-all-around transistor having a second threshold voltage that is different than the first threshold voltage. The second gate-all-around transistor comprises at least a second gate structure surrounding one or more channel layers of a second nanosheet stack. The second gate structure comprises a second dielectric layer comprising a second thickness that is greater than the first thickness.

In a further embodiment, a semiconductor device structure comprises a first gate structure surrounding one or more channel layers of a first nanosheet stack. The first gate structure comprises a first dielectric layer comprising a first thickness and further comprises one or more dipole materials diffused into the first dielectric layer. The semiconductor device structure further comprises a second gate structure a surrounding one or more channel layers of a second nanosheet stack. The second gate structure comprises a second dielectric layer comprising a second thickness that is greater than the first thickness, and wherein the second gate structure is free of the one or more dipole materials.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the embodiments of the invention, in which.

DETAIL DESCRIPTION

Figure 1:
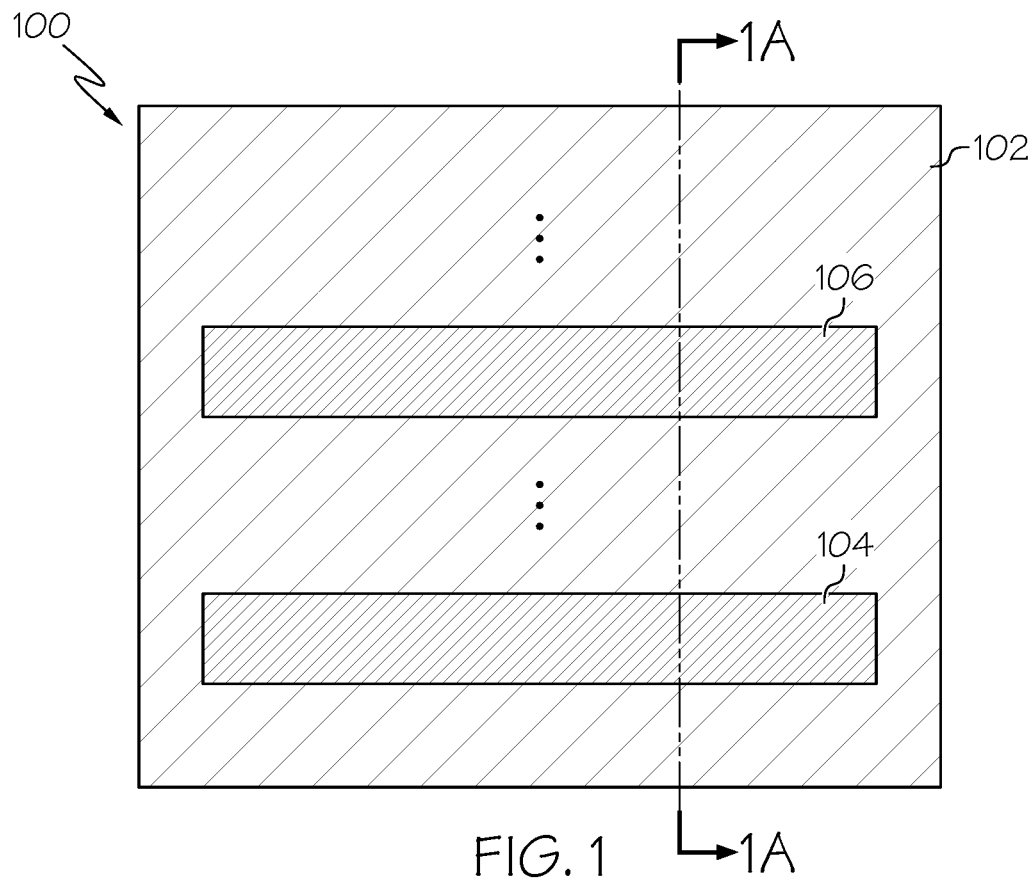
FIG. 1 is a planar view of a semiconductor structure comprising patterned nanosheet stacks according one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Various embodiments will now be discussed in further detail with regard to semiconductor devices and methods of manufacturing the same and, in particular, to a fabrication method and structure of a gate-all-around transistors comprising multi-threshold voltages utilizing high-k doping.

Gate-all-around (GAA) structure field effect transistors (FETs) such as nanosheet devices are a viable device option as CMOS technology continues to scale. Gate-all-around structure FETs can provide improved electrostatic control when compared to conventional transistor structures for satisfying requirements of aggressive device scaling.

Multiple Work Function gate stacks are indispensable for achieving CMOS technology with multiple threshold voltages (Vt) on fully depleted channel architectures (e.g. nanosheet) and taking advantage of higher mobility and smaller device variability due to absence of channel doping. Dipole engineering with multi-Vt patterning generally requires larger inter-sheet spacing (Tsus) for nanosheet devices. However, large Tsus degrades device performance due to increasing parasitic capacitance. As will be discussed in greater detail below, embodiments of the present invention overcome these and other problems be providing a method for fabricating nanosheet devices comprising multiple threshold voltages utilizing dipole engineering without sacrificing Tsus.

Figure 1A:
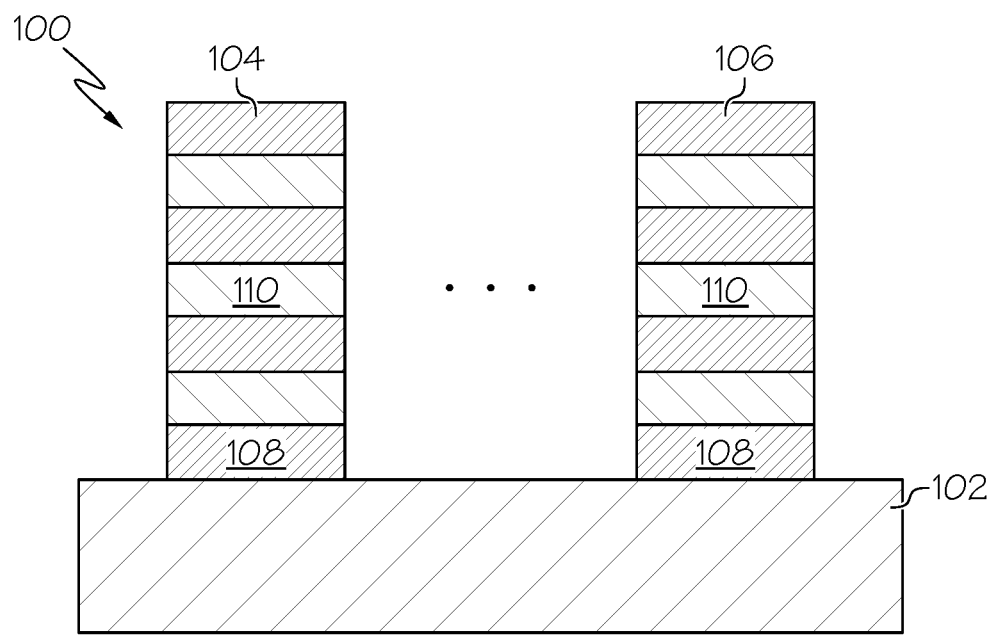
FIG. 1A is a cross-sectional view of the semiconductor structure shown in FIG. 1 according one embodiment of the present invention.

Referring now to the drawings in which like numerals represent the same or similar elements, FIGS. 1 and 1A show a semiconductor structure 100 comprising a substrate 102 and patterned nanosheet stacks 104, 106. It should be noted that although only two nanosheets stacks are shown embodiments of the present invention are not limited to such number of nanosheet stacks. In addition, the nanosheets stacks 104, 106 may or may be adjacent to each other or one or more additional nanosheet stacks may be disposed between the nanosheet stacks 104, 106 as represented by the ellipses in FIGS. 1 and 1A.

The substrate 102 may be a bulk substrate comprising silicon (Si). However, the substrate 102 may include materials other than or in addition to silicon. For example, the substrate 102 may include a semiconductor material including, but not necessarily limited to, silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, multiple layers of the semiconductor materials may be used as the semiconductor material of the substrate. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. The semiconductor substrate 102 may be doped, undoped or contain doped regions and undoped regions therein. The semiconductor substrate 102 may have regions with strain and regions without strain therein, or have regions of tensile strain and compressive strain.

The stacks 104, 106 may comprises alternating first (sacrificial) semiconductor material layers 108 and second (channel) semiconductor material layers 110 formed in contact with the substrate 102. In embodiments, where the substrate 102 is a bulk substrate, the stacks 104, 106 may be formed in contact with the substrate 102. Alternatively, in embodiments where the substrate 102 is an SOI substrate the stacks 104, 106 may be formed in contact with the insulating layer formed on the substrate 102. As used herein, a "semiconductor material" refers to a material having a conductivity in a range from, for example, $3.0 \times 10^{-4}$ Ohm-cm to $3.0 \times 10^{3}$ Ohm-cm, and includes an intrinsic semiconductor material, a p-doped semiconductor material, an n-doped semiconductor material, or a combination of semiconductor materials having different types of doping. The sacrificial layers 108 may comprise a first semiconductor material that can be removed selective to the second semiconductor material of the channel layers 110. Each of the at least one sacrificial layers 108 and the channel layers 110 may be single crystalline. In one embodiment, the entirety of each stacks 104, 106 may be single crystalline.

In one or more embodiments, the semiconductor material layers 108, 110 may be referred to as nanosheets or nanowires. These terms may be used interchangeable and refer to a sheet or a layer having nanoscale dimensions. A nanosheet may refer to a nanowire with a larger width, and/or nanowire may be used to refer to a nanosheet with a smaller width, and vice versa. In one embodiment, the sacrificial layers 108 include a silicon-containing semiconductor material in which the atomic concentration of silicon is greater than 80%, and the channel layers 110 include a germanium-containing semiconductor material in which the atomic concentration of germanium is greater than 15%. For example, the sacrificial layers 108 may include single crystalline silicon or a single crystalline silicon-germanium alloy in which the atomic concentration of germanium is less than 20%. However, other concentrations of Si and SiGe are applicable as well. In other embodiments, the sacrificial layers 108 include a silicon germanium material and the channel layers 110 include a silicon material.

In another embodiment, the sacrificial layers 108 include a first single crystalline compound semiconductor material, and the channel layers 110 include a second single crystalline compound semiconductor material that can be removed selective to the first single crystalline compound semiconductor material. For example, the sacrificial layers 108 comprise silicon-germanium (SiGe), and the channel layers 110 comprise silicon. In one embodiment, each of the sacrificial layers 108 is deposited as a single crystalline semiconductor material layer in epitaxial alignment with an underlying material layer. In one embodiment, each of the channel layers 10 is deposited as a single crystalline material layer in epitaxial alignment with an underlying material layer.

The thicknesses of the sacrificial layers 108 and the channel layers 110 may be selected such that the entirety of the epitaxial alignment of the sacrificial layers 108 and the channel layers 110 can be maintained throughout the entirety of the stack. Thus, the thickness of each of the sacrificial layers 108 and the channel layers 110 may be less than the corresponding critical thickness, which is the thickness at which an epitaxial material begins to lose epitaxial registry with the underlying single crystalline layer by developing dislocations. For example, the thickness of each of the sacrificial layers 108 and the channel layers 110 may be in a range from 3 nm to 20 nm, although lesser and greater thicknesses can also be employed.

In some embodiments, the sacrificial layers 108 and the channel layers 110 may be formed by a series of epitaxial growth processes. The terms "epitaxial growth", "epitaxial deposition", "epitaxially formed", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

In one embodiment, the number of repetitions for a pair of a sacrificial layer 108 and a channel layer 110 may be 2 or greater. In one embodiment, the number of repetitions for a pair of a sacrificial layer 108 and a channel layer 110 is in a range from, and including, 2 to, and including, 100 although other ranges are applicable as well. The stacks 104, 106 in one embodiment, begin, at the bottom, with a sacrificial layer 108 or with a channel layer 110. In one embodiment, the stack terminates, at the top, with a sacrificial layer 108 or with a channel layer 110.

In some embodiments, an optional cap material layer (not shown) may be formed on top of the sacrificial layers 108 and the channel layers 110. The cap material layer, in one embodiment, includes a dielectric material such as silicon nitride, silicon oxide, or a dielectric metal oxide, and can be formed by chemical vapor deposition (CVD). The thickness of the cap material layer, in one embodiment, ranges from 3 nm to 20 nm, although lesser and greater thicknesses can also be employed. The vertical nanosheet stacks 104, 106 may be formed by patterning the sacrificial layers 108 and the channel layers 110. For example, a photoresist layer may be applied over the top channel layer 110 (or optional cap layer if formed) and lithographically patterned to cover one or more contiguous areas. The shape of the contiguous area(s) covered by the patterned photoresist layer may be selected to include an elongated region having a same width and two end portions having a greater width than the elongated region. The pattern in the photoresist layer(s) may be transferred through the alternating stack by an anisotropic etch. A remaining portion(s) of the stack of the sacrificial layers 108 and the channel layers 110 constitute the vertical nanosheet stacks 104, 106. It should be noted that other processes for forming the nanosheet stacks 104, 106 are applicable as well. In some embodiments, the nanosheet stacks 104, 106 may be pFET device stacks, NFET device stacks, or a combination of both. It should be noted that embodiments of the present disclosure are not limited to the process discussed above for forming the nanosheet stacks 104, 106.

Figure 2:
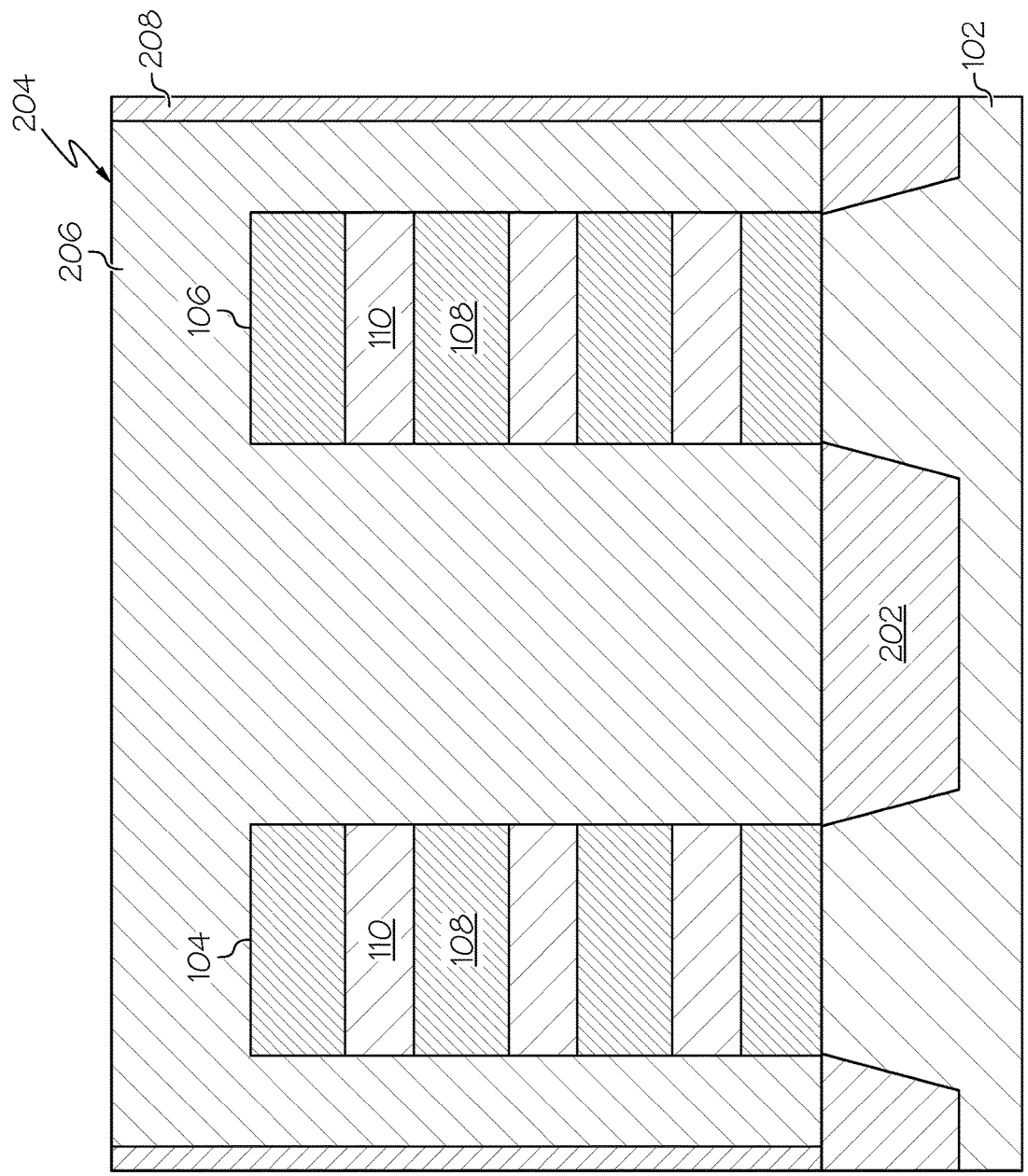
FIG. 2 is a cross-sectional view of the semiconductor structure after isolation regions and a disposable gate have been formed according one embodiment of the present invention.

FIG. 2 shows that that, in an embodiment where the substrate 102 is a bulk substrate, isolation regions 202 are formed between each of the nanosheet stacks 104, 106. FIG. 2 further shows that one or more disposable/dummy gate structures 204 are formed over and across (wrapping) portions of the nanosheet stacks 104, 106 that will serve as a channel region(s) of the device(s). In other embodiments, a single disposable gate structure may be formed as compared to separate disposable gate structures. In one embodiment, the disposable gate structure 204 comprises a disposable gate portion 206 and a disposable gate cap (not shown). In some embodiments, an etch stop layer may be formed on the nanosheet stacks 104, 106 prior to forming the disposable gate structure 204. The disposable gate structure 204 may then be formed on and in contact with the etch stop layer.

In one embodiment, the disposable gate portion 206 comprises a dielectric material. For example, the disposable gate portion 206 comprises amorphous carbon, amorphous silicon, diamond-like carbon (DLC), a dielectric metal oxide, silicon nitride, or an organosilicate glass. Alternatively, the disposable gate portion include a stack of a disposable material liner (not shown) and a disposable gate material portion (not shown). In this case, the disposable material liner may include a dielectric material such as silicon oxide. The disposable gate material portion, in one embodiment, includes a dielectric material, a semiconductor material, or a conductive material, provided that the disposable gate material portion is able to be removed selective to the dielectric materials of a planarization dielectric layer and a gate spacer to be subsequently formed. The disposable gate caps include a material such as silicon nitride and may be a bi-layer cap (e.g., nitride-oxide). The disposable gate structures in one embodiment, may be formed by deposition and patterning of at least one material layer. The patterning of the at least one material layer may be performed by a combination of lithographic methods and an anisotropic etch.

FIG. 2 further shows that a gate spacer 208 is formed around (wraps) the disposable gate structure 204. In one embodiment, the spacer 208 is formed by depositing a conformal dielectric material layer on the disposable gate structure 204 and the nanosheet stacks 104, 106 and anisotropically etching the conformal dielectric material layer. The conformal dielectric material layer includes a dielectric material that is different from the material of the disposable gate portions. For example, the conformal dielectric material layer may include silicon nitride, silicon oxide, and/or dielectric metal oxide. An anisotropic etch process is employed to anisotropically etch horizontal portions of the conformal dielectric material layer. Further, vertical portions of the conformal dielectric material layer may be recessed below a top surface of the disposable gate caps.

After the disposable gate structure 204 and spacer 208 have been formed exposed portions of the nanosheet stacks 104, 106, which do not underlie a disposable gate 204 and spacer 208, are removed or recessed. For example, a directional etching process such as a reactive-ion-etching (RIE) process may be utilized to remove the exposed portions of the nanosheet stacks 104, 106. This etching process results in a trench being formed between the neighboring disposable gate stacks. Each of the trenches may expose a portion of the top surface of the substrate 102; ends of the sacrificial layers 108; and ends of the channel layers 110.

Inner spacers 1308 (FIG. 13A) are formed in contact with sidewalls of the sacrificial layers 108. In one embodiment, the inner spacers 1308 are formed by removing a portion of the sacrificial layers 108 to reduce the size of the sacrificial layers 108 in at least one lateral dimension (i.e., length, width). The portion of the sacrificial layers 108 may be removed using an isotropic etch (e.g., wet chemical etch, non-directional dry plasma etch, etc.), where the isotropic etch etches laterally into the sacrificial layers 108. The isotropic etch may remove a predetermined amount of material from the sacrificial layers 108, where the etch may be a timed etch to uniformly remove an equal amount of material from each exposed end. The isotropic etch may form indentations having a predetermined indentation depth into the sacrificial layers. After the etching process, the channel layers 110 may extend passed the sacrificial layers 108 by a predetermined distance. Each of the indentations may extend into the area below the disposable gate spacer 208.

A deposition process such as ALD, PEALD, CVD, PECVD, or combinations thereof, may be performed to conformally deposit the inner spacer material within the indentations and form the inner spacers 1308. Portions of the inner spacers 1308 that extend out beyond the disposable gate spacers 208 may be removed by a directional etch (e.g., RIE). In one or more embodiments, the inner spacers 1308 may comprise silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

Figure 13:
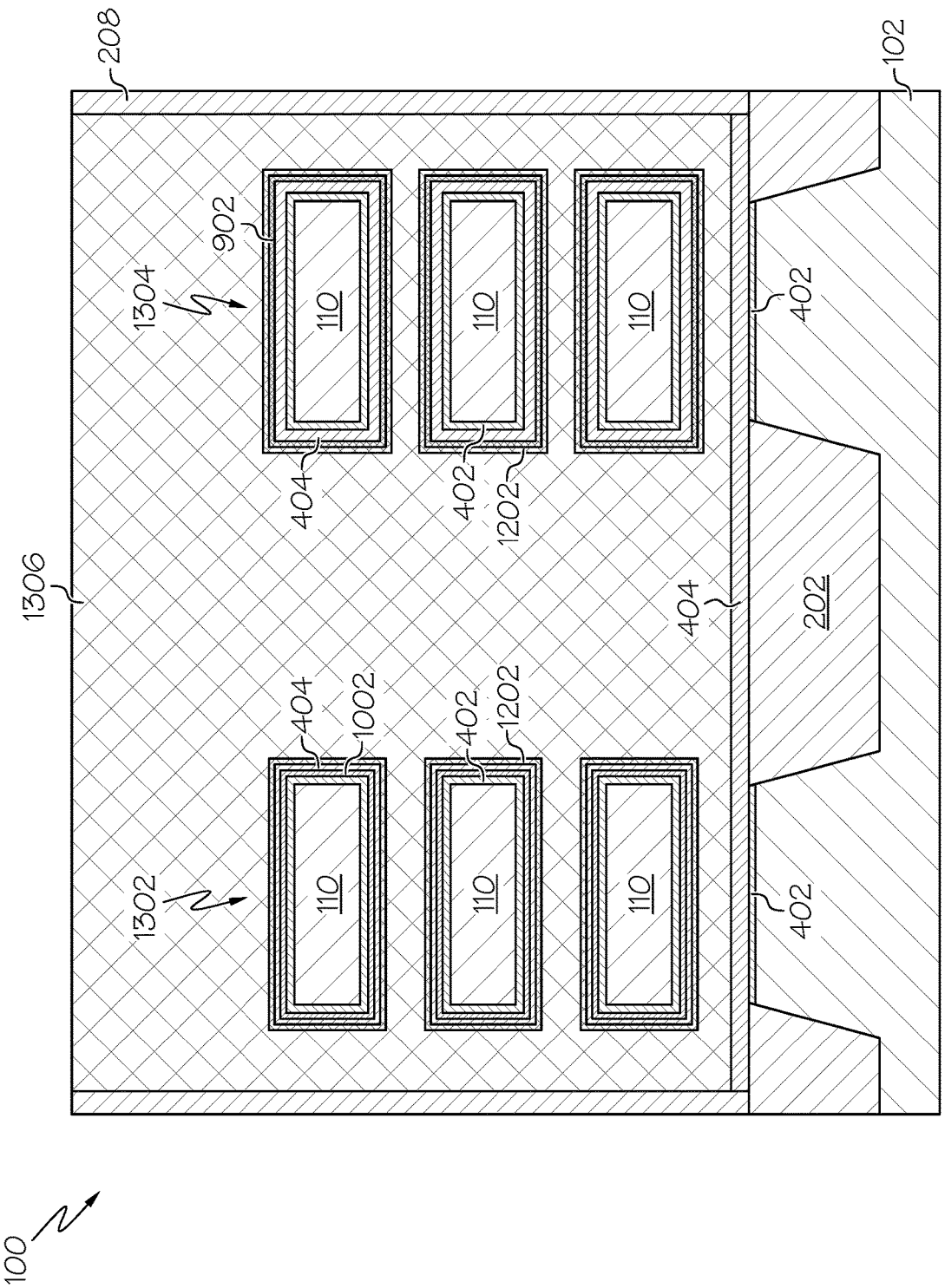
FIG. 13 is a cross-sectional view of the semiconductor structure after completion of a plurality of gate-all-around transistors comprising multi-threshold voltages according one embodiment of the present invention.
Figure 13A:
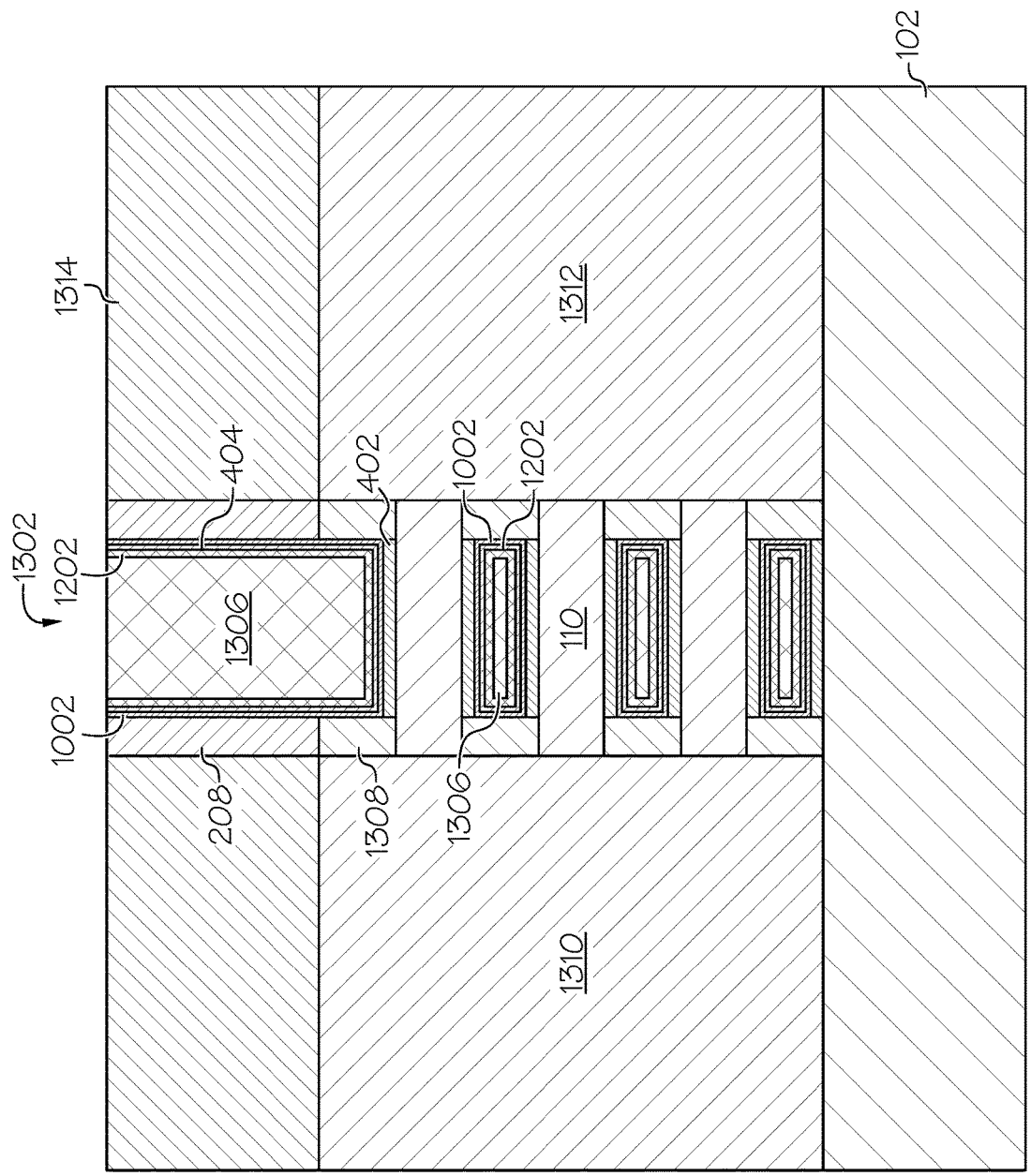
FIG. 13A is a cross-sectional view of the semiconductor structure taken along a line that passes through one of the dipole diffused gate-all-around transistors of FIG. 13 according one embodiment of the present invention.

A selective epitaxy process may then be performed to form source and drain regions 1310, 1312 (FIG. 13A). In one embodiment, the ends of the sacrificial layers 108 and/or the ends of the channel layers 110 of the nanosheet stacks 104, 106 may be used as seeds for the epitaxy process. During the selective epitaxy process, a semiconductor material is deposited only on semiconductor surfaces, and does not nucleate on dielectric surfaces. The source region 1310 grows from surfaces of the sacrificial layers 108 and/or channel layers 110 located on one side of the disposable gate structures 204. The drain region 1312 grows from surfaces of the sacrificial layers 108 and/or the channel layers 110 located on the other side of the disposable gate structures 204.

Each of the source and drain regions 1310, 1312, in one embodiment is single crystalline, and is epitaxially aligned to the single crystalline structure of the vertical stack of the sacrificial layers 108 and the channel layers 110. The source and drain regions 1310, 1312, in one embodiment, may be formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. In one embodiment, activation of the dopants forms a sharp junction. It should be noted that one or more embodiments are not limited to the process discussed above for forming the source and drain regions 1310, 1312.

An inter-layer dielectric (ILD) layer 1314 (FIG. 13A) may then be deposited over the nanosheet stacks 104, 106, disposable gate structures 204, and source/drains. A planarization process is performed to planarize the ILD down to be coplanar with a top of the disposable gate structures 204. The planarization process may include a chemical mechanical polishing (CMP) process. The ILD layer may comprise silicon oxide, oxynitride, or other suitable materials.

Figure 3:
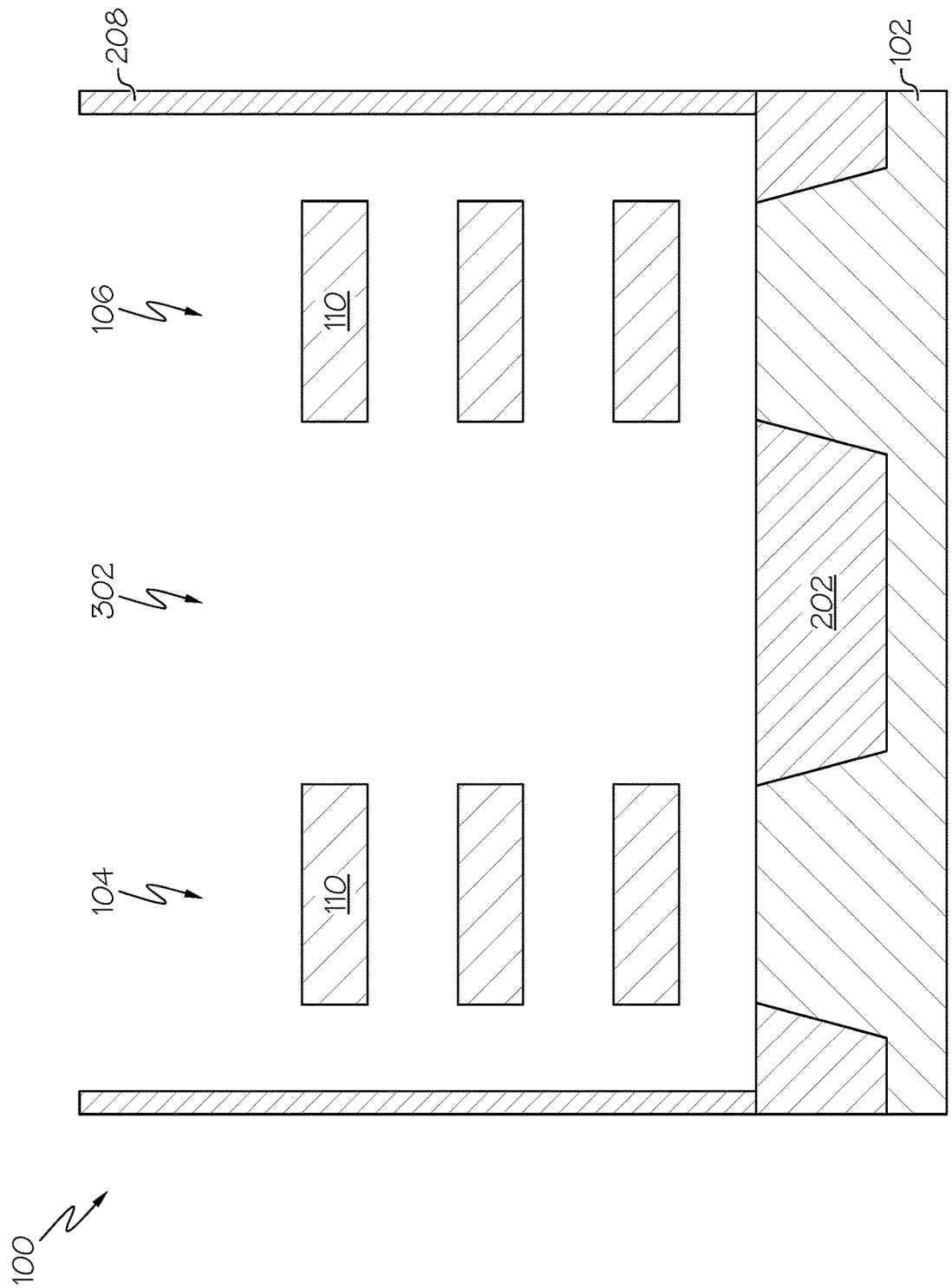
FIG. 3 is a cross-sectional view of the semiconductor structure after the disposable gate and sacrificial layers of the nanosheet stacks have been removed according one embodiment of the present invention.

The disposable gate structure(s) 204 may then be selectively removed via selective etching as shown in FIG. 3. The selective etching process may include, for example, an isotropic etch and/or an anisotropic etch. A gate cavity 302 may be formed in the volume from which the disposable gate structure 204 was removed. A portion of the top surface of the top/upper most layer of each nanosheet stack 104, 106 is exposed within the gate cavity 302. Sidewall surfaces of a portion of the spacer 308 and the sacrificial/channel layers 108, 110 are also exposed within the gate cavity 302.

FIG. 3 further shows that a selective etching process is performed to remove the sacrificial layers 108 selective to the channel layers 110 of each nanosheet stack 104, 106. For example, a wet etch process or a reactive ion etch process can be utilized to selectively remove the sacrificial layers 108 of the nanosheet stack 104, 106. This process forms cavities 302 between each of the channel layers 110 of the nanosheet stack 104, 106, which are anchored by the epitaxy material of the source/drain regions 1310, 1312.

A replacement gate fabrication process may then be performed to form one or more replacement gates within the gate cavity 302 and surrounding the nanosheet channels 110. In one or more embodiments, a replacement gate is formed for each of the nanosheet devices such that two or more of the nanosheet devices have different threshold voltages. Embodiments of the present invention may utilize dipole engineering to obtain the multiple threshold voltages. However, dipole engineering usually requires larger inter-sheet spacing (Tsus) than conventional fabrication processes. A large Tsus usually degrades device performance due to increasing parasitic capacitance. Embodiments of the present invention overcome these problems without sacrificing inter-sheet spacing by utilizing high-k crystallization and not requiring the patterning of the dipole forming layer.

Figure 4:
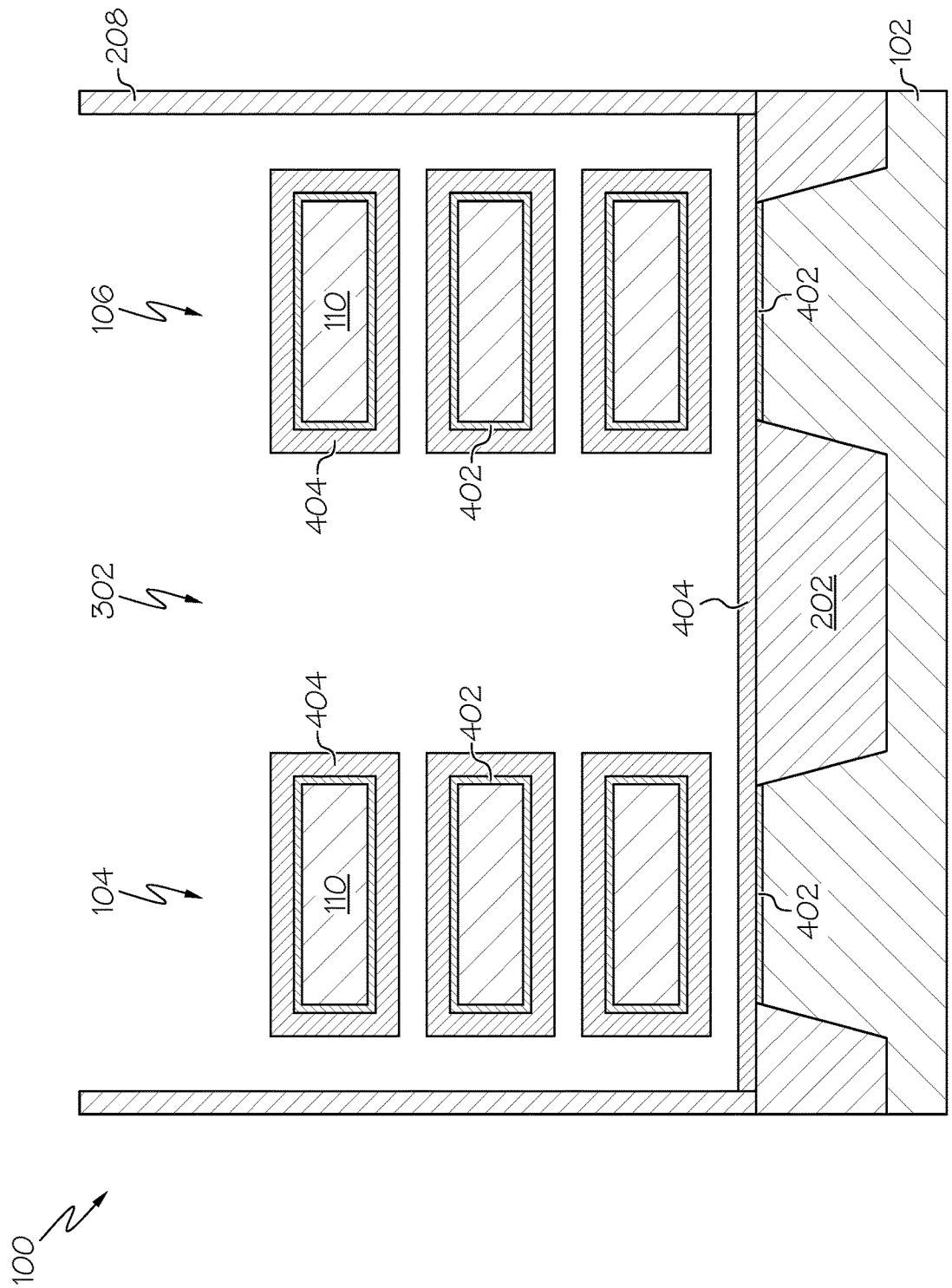
FIG. 4 is a cross-sectional view of the semiconductor structure after a gate dielectric layer has been conformally formed over the structure according one embodiment of the present invention.

For example, FIG. 4 shows that an interfacial layer (IL) 402 may be formed in contact with the substrate 102. The IL 402 is further formed in contact with and surrounding the channel layers 110 of each nanosheet stack 104, 106. In one embodiment, the IL 402 may be a native oxide layer such as, but not limited to, silicon oxide. FIG. 4 further shoes that a dielectric layer 404 may then be formed on and in contact with the IL 402 and isolation layers 202, and further formed in contact with and surrounding the IL 402 on the channel layers 110. The dielectric layer 404 may be formed using, for example, ALD. The thickness of the dielectric layer 404 may range from 5 Å to 15 Å although other thicknesses are applicable as well. A post deposition anneal may be performed to densify the dielectric layer 404, remove contamination from the dielectric layer 404, etc. The annealing process may be performed at a range of 600 to 1000° C. although other temperatures are applicable as well. It should be noted that the post deposition anneal may be performed at a subsequent point in the fabrication process as well.

The term "high-κ" as used herein refers to a material having a relative dielectric constant κ which is much higher than that of silicon dioxide (e.g., a dielectric constant x=25 for hafnium oxide rather than 4 for silicon dioxide. High-K dielectric materials may include, but are not limited to, transition metal oxides such as hafnium oxide (e.g., HfO2), hafnium silicon oxide (e.g., HfSiO4), hafnium silicon oxynitride (HfwSixOyNz), lanthanum oxide (e.g., La2O3), lanthanum aluminum oxide (e.g., LaAlO3), zirconium oxide (e.g., ZrO2), zirconium silicon oxide (e.g., ZrSiO4), zirconium silicon oxynitride (ZrwSixOyNz), tantalum oxide (e.g., TaO2, Ta2O5), titanium oxide (e.g., TiO2), barium strontium titanium oxide (e.g., BaTiO3-SrTiO3), barium titanium oxide (e.g., BaTiO3), strontium titanium oxide (e.g., SrTiO3), yttrium oxide (e.g., Y2O$_3$), aluminum oxide (e.g., Al2O3), lead scandium tantalum oxide (Pb(ScxTa1−x)O3), and lead zinc niobate (e.g., PbZn1/3 Nb2/3 O3). The high-k material can further include dopants such as lanthanum and/or aluminum. The stoichiometry of the high-K compounds can vary.

Figure 5:
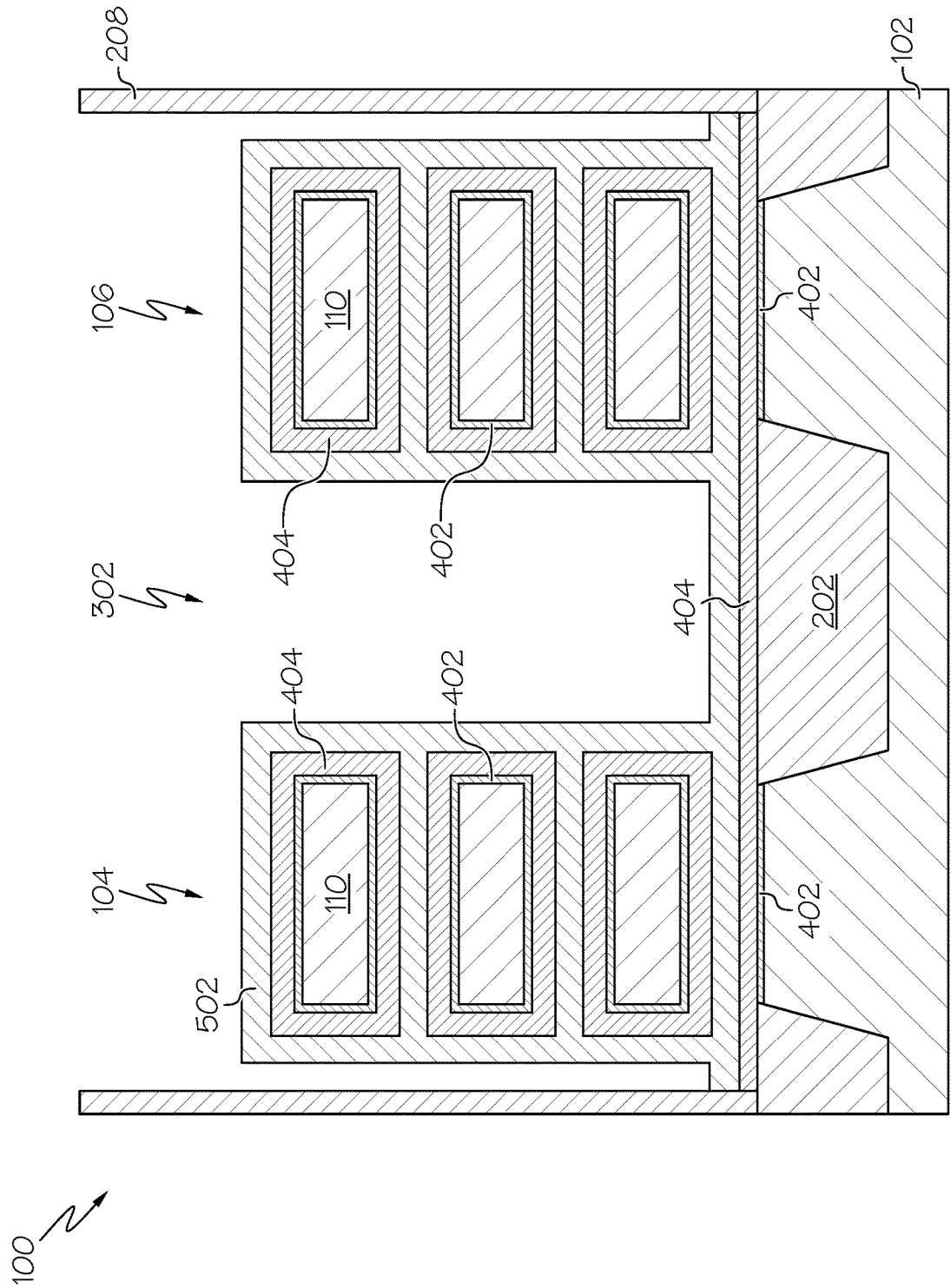
FIG. 5 is a cross-sectional view of the semiconductor structure after a patterning layer has been conformally formed over the structure according one embodiment of the present invention.

FIG. 5 shows that after the dielectric layer 404 has been formed, a patterning layer 502 may be formed/deposited over and in contact with the dielectric layers 404. The patterning layer 502 may surround the dielectric layers 404 on the channel layer 110 and fill in the gap between each channel layer 110. The patterning layer 502 may be a conformal layer formed using, for example, ALD and comprise a material that may be selectively removed with respect to the dielectric layer 404. For example, the patterning layer 502 may comprise titanium nitride or other applicable materials.

Figure 6:
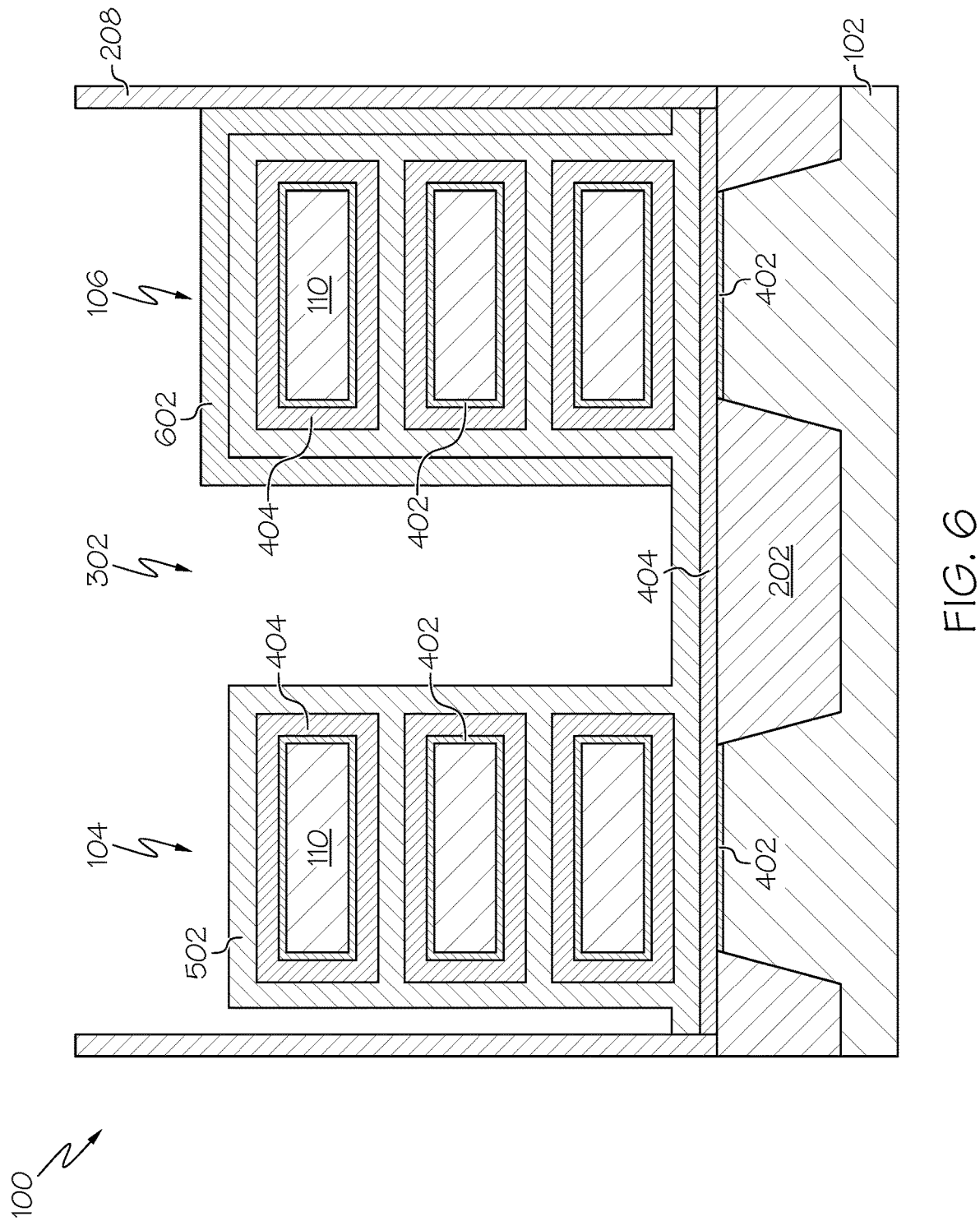
FIG. 6 is a cross-sectional view of the semiconductor structure after a masking layer has been conformally formed over one or more nanosheets stacks where dipole diffusion is to be prevented according one embodiment of the present invention.

After the patterning layer 502 may be formed, an organic planarization layer (OPL) 602 may be formed over the structure and then patterned as shown in FIG. 6. The OPL 602 may be deposited by a spin coat process, spin-on PGMEA, CVD, PECVD, evaporation, chemical solution deposition, and/or the like. The OPL 602 may be patterned using one or more patterning techniques such that portions of the OPL 602 are removed from one or more first nanosheet stacks 104 where dipole diffusion is to occur.

Figure 7:
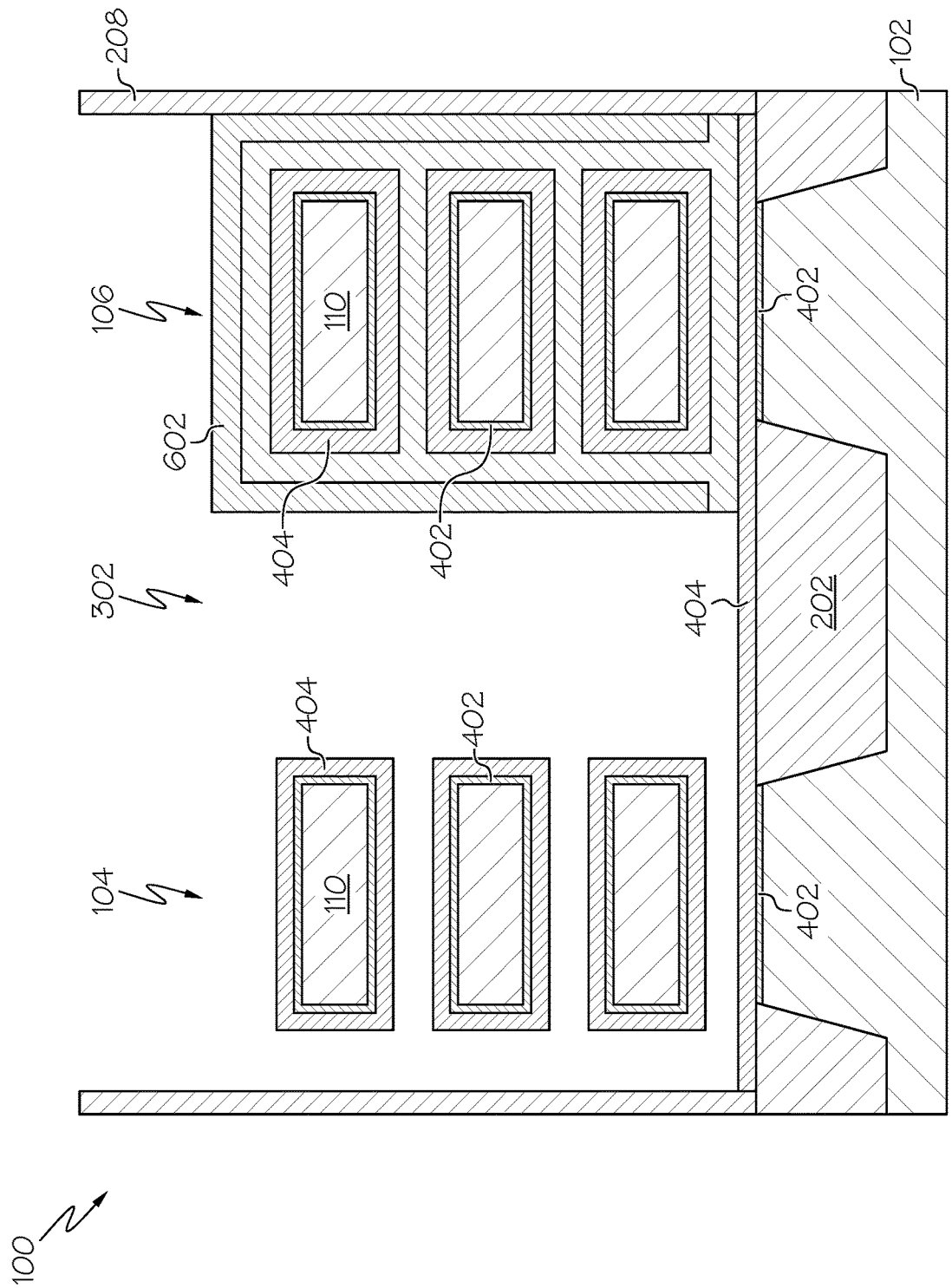
FIG. 7 is a cross-sectional view of the semiconductor structure after a portion of the gate dielectric layer has been etched and the patterning layer has been removed from one or more nanosheets stacks where dipole diffusion is to occur according one embodiment of the present invention.

The exposed patterning layer 502 may then be removed selective to the dielectric layer 404, as shown in FIG. 7. In one embodiment, the patterning layer 502 may be removed by a room temperature standard clean process utilizing deionized water, ammonia water, and hydrogen peroxide. However, other processes may be used to selectively remove the patterning layer 502 as well. In one or more embodiments, the etching process may etch the dielectric layer 404 not underlying the OPL 602. However, since the dielectric layer 404 is etched at a lower etch rate than the OPL 602 only a portion of the dielectric layer 404 may be removed.

Figure 8:
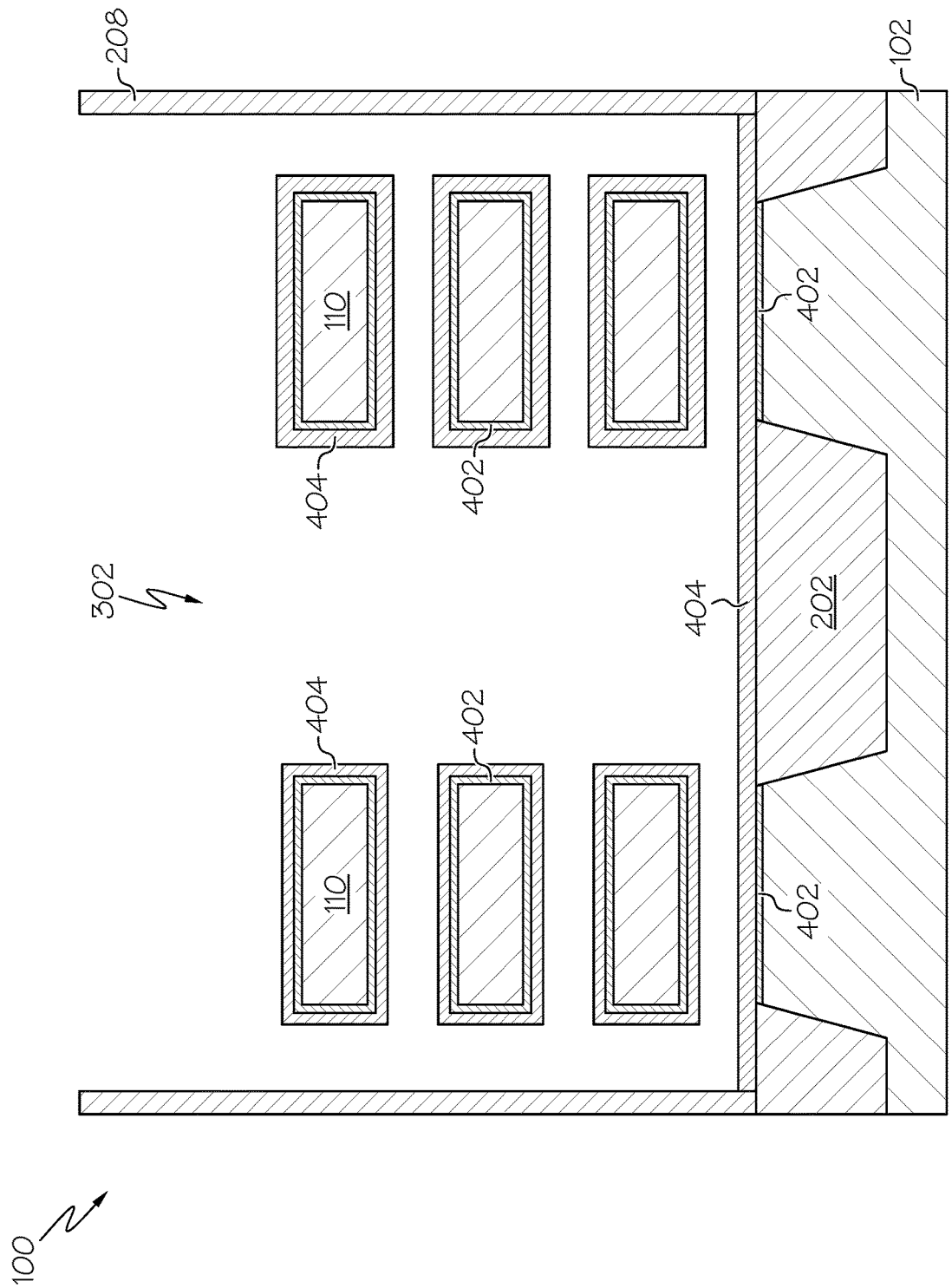
FIG. 8 is a cross-sectional view of the semiconductor structure after the masking layer and the remaining portion of the patterning layer have been removed according one embodiment of the present invention.

FIG. 8 shows that after the exposed portions of the patterning layer are removed, the remaining OPL 602 and patterning layer 502 are removed from one or more of second nanosheet stack(s) 106 where dipole diffusion is not to occur. For example, the remaining OPL 602 may be removed utilizing a process similar to that discussed above with respect to FIG. 6, and the patterning layer 502 may be removed utilizing a process similar to that discussed above with respect to FIG. 7. As noted above, the dielectric layer 404 of the second nanosheet stack(s) 106 may be partially etched during the removal of the patterning layer 502. In addition, since the dielectric layers 404 of the first nanosheet stack(s) 104 (where dipole diffusion is to occur) are exposed during the patterning layer 502 removal process for the second nanosheet stack(s) 106 these dielectric layers 404 are further partially etched. Therefore, the thickness of the dielectric layers 404 on the first nanosheet stacks 104 is less than the thickness of the dielectric layers 404 on the second nanosheet stacks 106. In one embodiment, the difference in thickness may range from 2 Å to 6 Å although other ranges are applicable as well.

Figure 9:
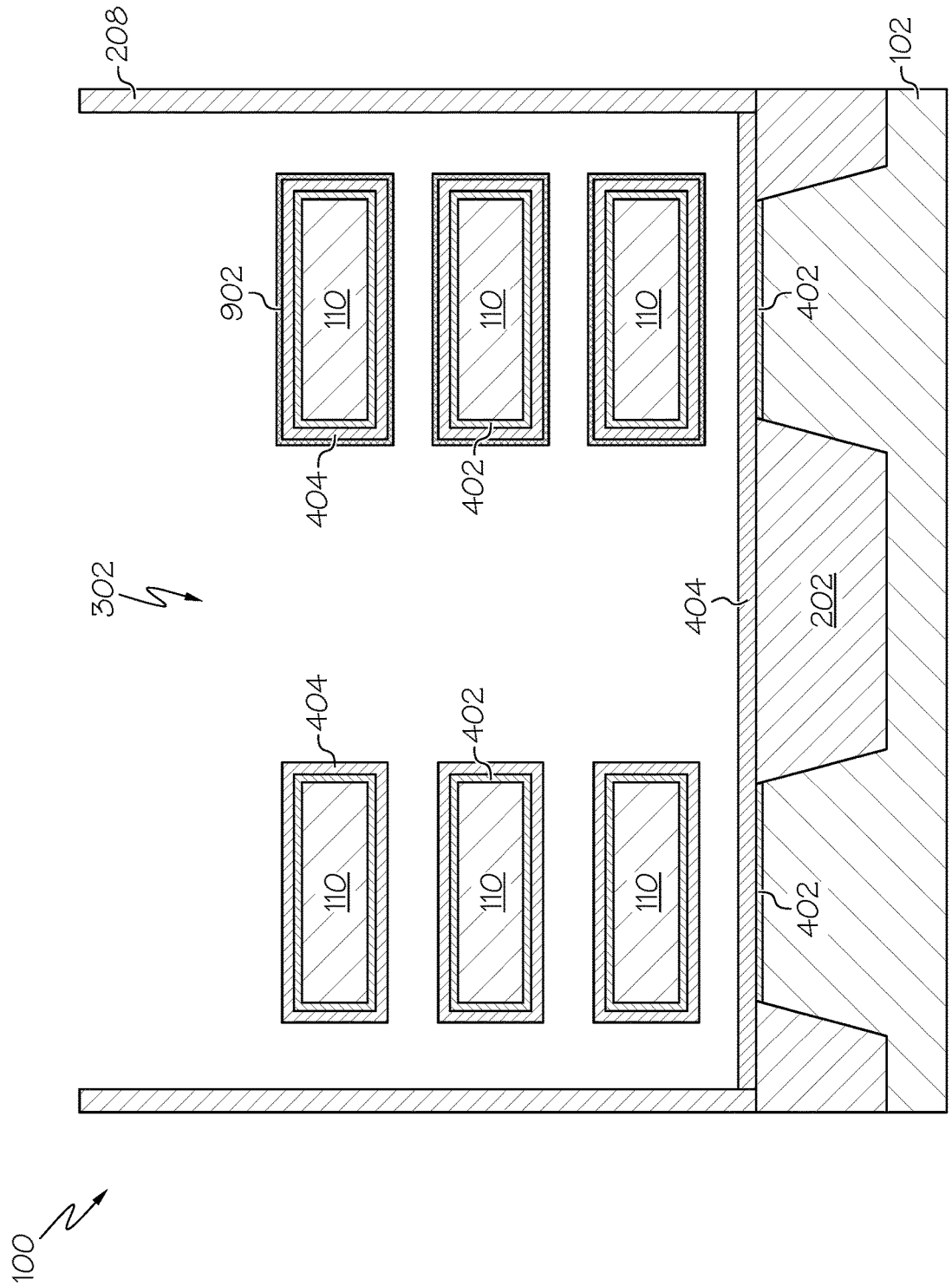
FIG. 9 is a cross-sectional view of the semiconductor structure after a portion of the dielectric on the one or more nanosheets stacks where dipole diffusion is to be prevented have been crystallized according one embodiment of the present invention.

An annealing process may then be performed to crystallize at least a portion of the dielectric layer 404 on the second nanosheet stack(s) 106 as shown in FIG. 9. One example of an annealing process is laser spike anneal at a range of 800° C. to 1200° C. although other annealing processes and temperature ranges are applicable as well. As discussed above, the dielectric layer 404 on second nanosheet stack(s) 106 comprises a greater thickness than the dielectric layer 404 on the first nanosheet stack(s) 104. Therefore, the anneal process crystallizes a portion 902 of the dielectric layer 404 on the second nanosheet stack(s) 106 while the dielectric layer 404 on first nanosheet stack(s) 106 remains amorphous.

Figure 10:
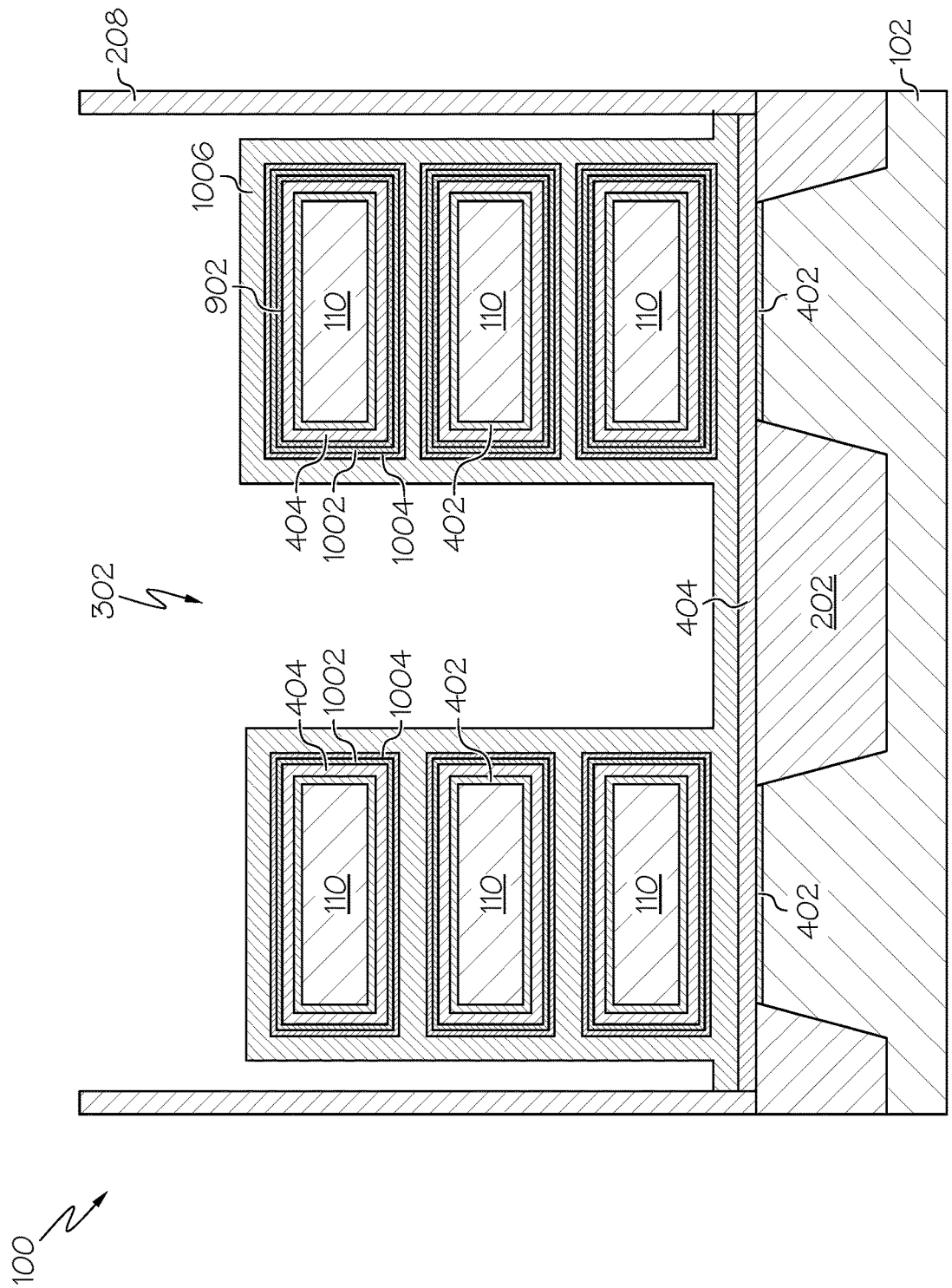
FIG. 10 is a cross-sectional view of the semiconductor structure after a dipole forming layer has been formed over the structure and diffused into the etched dielectric layer of the one or more nanosheets stacks according one embodiment of the present invention.

At least one dipole forming layer 1002 is then deposited/formed over the structure 100 as shown in FIG. 10. The dipole forming layer 1002 may be formed, for example, using ALD and contacts the dielectric layer 404 of the dipole diffusion nanosheet stack(s) 104 and the crystallized portion 902 of the dielectric layer 404 of the non-diffusion nanosheet stack(s) 106. The dipole forming layer 1002 may surround the channel layers 110. In one embodiment, the dipole forming layer 1002 may be a transition metal oxide (e.g., lanthanum oxide, aluminum oxide, etc.) and/or comprise one or more materials/elements composed of Group IIA or IIIB elements.

FIG. 10 further shows that a sacrificial layer 1004 may then be formed on and in contact with the dipole forming layer 1002, and further formed in contact with and surrounding the dipole forming layer 1002 on the channel layers 110. The sacrificial layer 1004 may be formed using, for example, ALD. In one example, the sacrificial layer 1004 layer may comprise titanium nitride, although other materials are applicable as well. The sacrificial layer 1004 may be used for reliability during a subsequent anneal. A capping layer 1006 may then formed over the structure 100 and in contact with the sacrificial layer 1004. The capping layer 1006 may surround the sacrificial layer 1004 on the channel layers 110 and fill in the gap between each channel layer 110. The capping layer 1006 may be a conformal layer formed using, for example, ALD. In on example, the capping layer 1006 may comprise amorphous silicon although other materials are applicable as well. The capping layer 1006 protects the structure 100 from any further oxidation.

After the capping layer 1006 has been formed, an annealing process such as spike annealing may be performed to drive-in or diffuse the dipole forming layer 1002 down to the IL 402 and dielectric layer 404 interface of the first nanosheet stack(s) 104. The diffusion of the dipole forming layer 1002 at the first nanosheet stack(s) 104 causes a dipole-induced threshold voltage shift that reduces or increases the threshold voltage of the transistor(s) 1302, 1304 (FIG. 13) formed from the nanosheet stack(s) 104 depending on the dipole type and device types (e.g., NFET or PFET). The crystallized portion 902 of the dielectric layer 404 of the other second nanosheet stack(s) 106 prevents the dipole forming layer 1002 from being driven or diffused into the nanosheet stack(s) 106. Therefore, the nanosheet stack(s) 106 having the crystallized portion 902 does not experience the dipole-induced threshold voltage shift. Accordingly, the first nanosheet stack(s) 104 is associated with a different (i.e., higher or lower) threshold voltage than the second nanosheet stack(s) 106.

Figure 11:
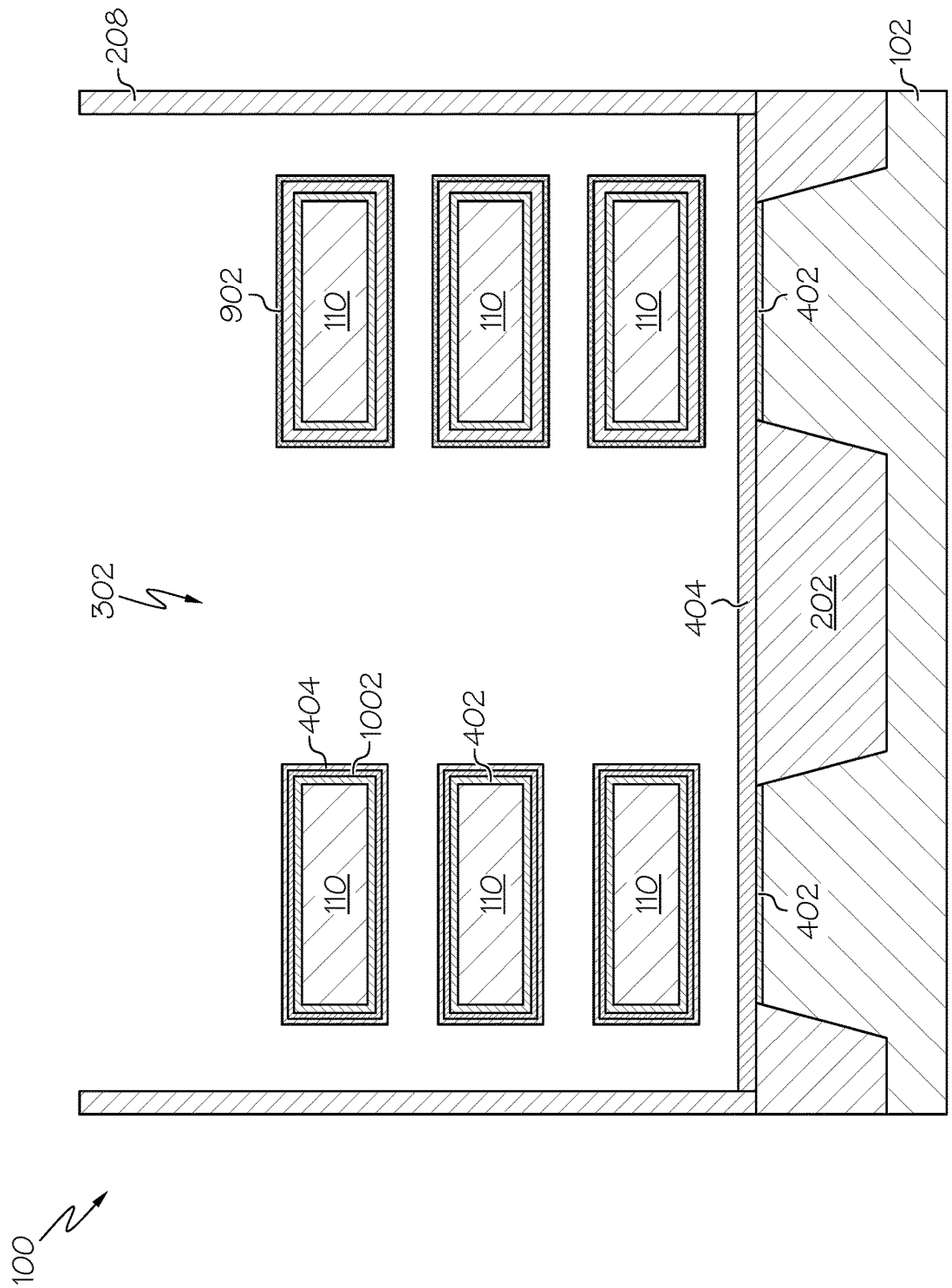
FIG. 11 is a cross-sectional view of the semiconductor structure after any remaining dipole material reside has been removed according one embodiment of the present invention.

FIG. 11 shows that after the dipole forming layer 1002 diffusion process has completed, the capping layer 1006 is removed using, for example, a dry etch process. After the capping layer 1002 has been removed, the sacrificial layer 1004 may then be removed using, for example, a room temperature standard clean process utilizing deionized water, ammonia water, and hydrogen peroxide. Any dipole forming layer 1002 residue may then be removed using a wet cleaning/etching process such as, for example, a mixture of dilute hydrofluoric acid (DHF) and hydrochloric acid (HCl) wet cleaning process or any other applicable process.

Figure 12:
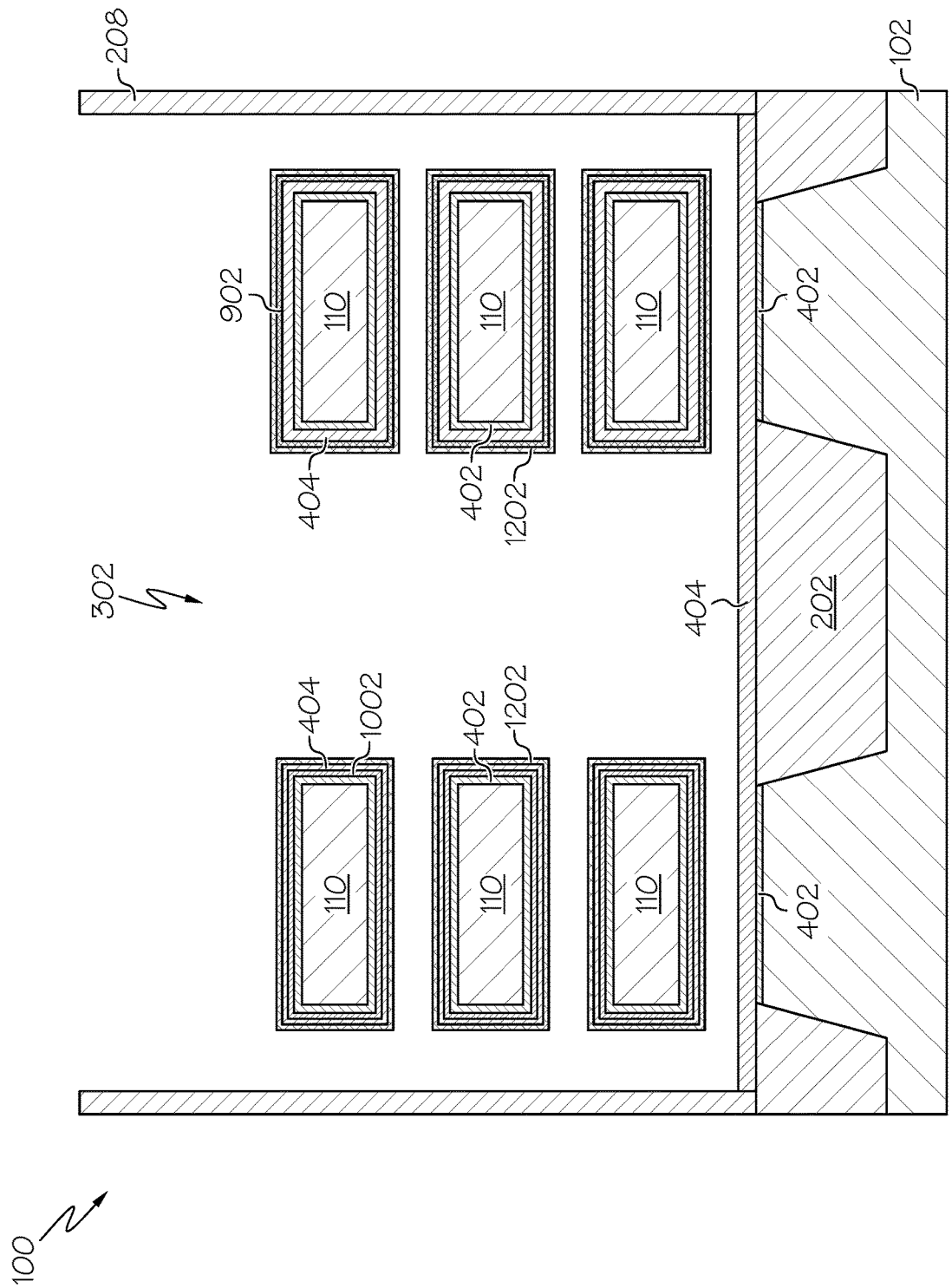
FIG. 12 is a cross-sectional view of the semiconductor structure after additional gate dielectric material has been deposited on the structure according one embodiment of the present invention.

FIG. 12 shows that after any remaining residue from the dipole forming layer 1002 has been removed, additional gate dielectric material 1202 is deposited on and in contact with the existing dielectric layer 404 on the first nanosheet stack(s) 104 and the crystallized portions 902 of the existing dielectric layer 404 on the second nanosheet stack(s) 106. The additional gate dielectric material 1202 is further formed surrounding the channel layers 110. The additional gate dielectric material 1202 helps prevent any leakage issue for the first nanosheet stack(s) 104 since its existing dielectric layer 404 had a reduced thickness.

After the additional gate dielectric layer 1202 has been formed processing may continue to complete the transistor devices. For example, FIGS. 13 and 13A show a completed gate-all-around device 1302, 1304. In this example, a conductive gate electrode 1306 may be formed by depositing a gate material or combination of materials into the gate cavity/trench 302 on the gate dielectric 1202. By way of example only, in the case of a metal gate, a combination of gate metals may be used that constitute the conductive gate electrode 1306. For instance, a work function setting metal layer (not shown) may be deposited onto the gate dielectric 1202, followed by a filler metal layer. The conductive gate electrode 1306 may surround at least a portion of the channel layers 110. The work function layer may be formed on the exposed portion(s) of the gate dielectric layer 1202 between the channel layers 110. The work function layer may be formed on the gate dielectric layer 1202 to adjust the electrical properties of the conductive gate electrode 1306. In various embodiments, the work function layer may be optional. In one or more embodiments, the work function layer may fill in the spaces between the gate dielectric layers 1202. The work function layer may be formed by a conformal deposition, for example, ALD.

In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. In various embodiments, the work function layer may have a thickness in the range of about 3 nm to about 11 nm, or can have a thickness in the range of about 5 nm to about 8 nm.

The metal fill layer may be formed on the gate dielectric layer 1202 and/or work function layer if present utilizing a metal fill process. This process fills the gate cavity 302 and any cavities between the nanosheet channel layers 110 with a conductive gate electrode material(s). In various embodiments, the metal fill layer may be blanket deposited on the exposed surfaces of the gate dielectric layer 1202 and/or work function layer. In one or more embodiments, the metal fill layer may be a conductive metal, where the metal may be aluminum (Al), gold (Au), silver (Ag), copper (Cu), tungsten (W), titanium (Ti), molybdenum (Mo), cobalt (Co), or a conductive carbon material (e.g., carbon nanotube, graphene, etc.), or any suitable combinations thereof. The metal fill layer, gate dielectric layer 1202, and optionally the work function layer may form a replacement gate structure on one or more the channel layers 110, where the metal fill layer and work function layer form the conductive gate electrode 1306. The resulting gate structure may be referred to a gate-all-around (GAA) configuration since the gate surrounds/wraps one or more of the nanosheet channel layers 110. It should be noted that one or more embodiments are not limited to the process discussed above for forming the replacement gate structures FIG. 13A further shows how that an inter-layer dielectric (ILD) layer 1314 is deposited over the structure 100. A planarization process may be performed to planarize the ILD 1314 down to be coplanar with a top of the gate electrode 1306. The planarization process may include a chemical mechanical polishing (CMP) process. The ILD layer 1314 may comprise silicon oxide, silicon nitride, oxynitride, or other suitable materials.

Figure 14:
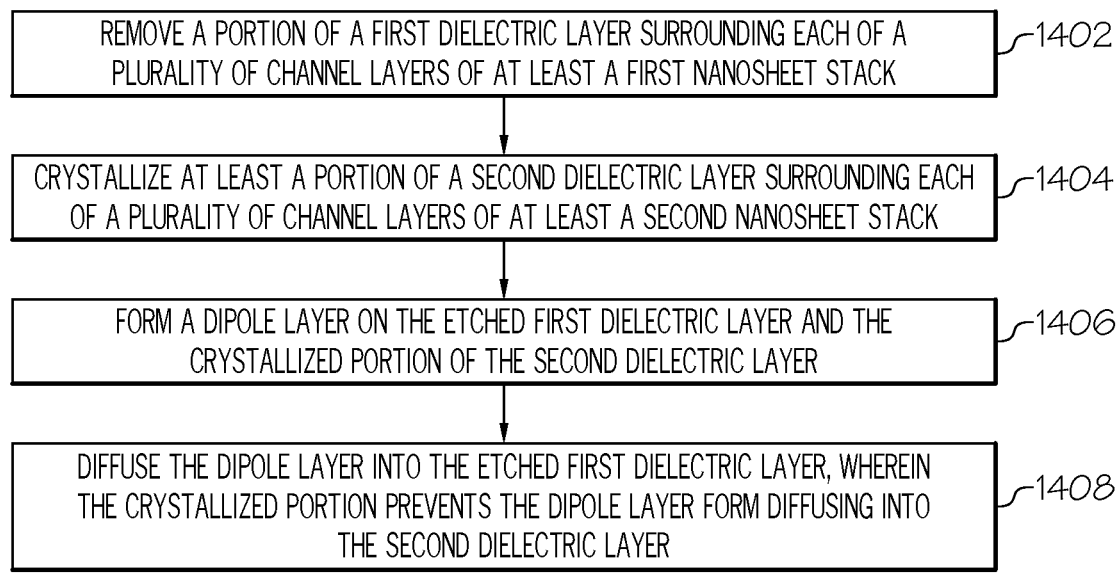
FIG. 14 is an operational flow diagram illustrating one example of a process for forming a multi-threshold gate-all-around transistors according one embodiment of the present invention.

FIG. 14 is an operational flow diagram illustrating one example of a process for forming a gate-all-around transistors having multiple threshold voltages according one example of the present invention. It should be noted that each of the steps shown in FIG. 14 has been discussed in greater detail above with respect to FIGS. 1 to 13A. A portion of a first dielectric layer surrounding each of a plurality of channel layers of at least a first nanosheet stack is removed at step 1402. At least a portion of a second dielectric layer surrounding each of a plurality of channel layers of at least a second nanosheet stack is crystallized at step 1404. A dipole layer is formed on the etched first dielectric layer and the crystallized portion of the second dielectric layer at step 1406. The dipole layer is diffused into the etched first dielectric layer at step 1408. The crystallized portion prevents the dipole layer form diffusing into the second dielectric layer.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for forming a semiconductor device structure, the method comprising at least:

etching a portion of a first dielectric layer surrounding each of a plurality of channel layers of at least a first nanosheet stack;

crystallizing at least a portion of a second dielectric layer surrounding each of a plurality of channel layers of at least a second nanosheet stack;

forming a dipole layer on the etched first dielectric layer and the crystallized portion of the second dielectric layer; and diffusing the dipole layer into the etched first dielectric layer, wherein the crystallized portion prevents the dipole layer from diffusing into the second dielectric layer.

2. The method of claim 1, further comprising:

removing at least any remaining residue from the dipole layer after diffusing the dipole layer into the etched first dielectric layer.

3. The method of claim 2, further comprising:

forming an additional dielectric layer on and in contact with at least the etched first dielectric layer.

4. The method of claim 1, wherein prior to removing the portion of the first dielectric layer the method further comprises:

forming a patterning layer over the at least first nanosheet stack and the at least second nanosheet stack; and forming a masking layer over the patterning layer formed over the at least second nanosheet stack.

5. The method of claim 4, wherein removing the portion of the first dielectric layer comprises:

etching away the patterning layer formed over the at least first nanosheet stack, wherein the etching further removes the portion of the first dielectric layer.

6. The method of claim 4, further comprising:

removing the masking layer and the patterning layer formed over the at least second nanosheet stack prior to forming the dipole layer.

7. The method of claim 1, wherein diffusing the dipole layer induces a threshold voltage shift at the at least first nanosheet stack such that a first device formed from the at least first nanosheet stack comprises a different threshold voltage than a second device formed from the at least second nanosheet stack.

* * * * *